(12) United States Patent  
Ooyachi et al.

(10) Patent No.: US 12,653,000 B2  
(45) Date of Patent: Jun. 9, 2026

(54) SUBSTRATE HOLDING MEMBER

(71) Applicant: Niterra Co., Ltd., Nagoya (JP)

(72) Inventors: Kazuaki Ooyachi, Nagoya (JP);  
Hiroyuki Nakamura, Nagoya (JP)

(73) Assignee: NITERRA CO., LTD., Nagoya (JP)

( * ) Notice: Subject to any disclaimer, the term of this patent is extended or adjusted under 35 U.S.C. 154(b) by 274 days.

(21) Appl. No.: 18/484,178

(22) Filed: Oct. 10, 2023

(65) Prior Publication Data

US 2024/0128117 A1 Apr. 18, 2024

(30) Foreign Application Priority Data

Oct. 12, 2022 (JP) ................................. 2022-163652

(51) Int. Cl.  
*H10P 72/78* (2026.01)  
*H10P 72/76* (2026.01)

(52) U.S. Cl.  
CPC .......... *H10P 72/78* (2026.01); *H10P 72/7614* (2026.01); *H10P 72/7624* (2026.01)

(58) Field of Classification Search  
CPC .. H01L 21/6838; H01L 21/6875; H10P 72/78; H10P 72/7614  
See application file for complete search history.

(56) References Cited

U.S. PATENT DOCUMENTS

2017/0345701 A1* 11/2017 Ishino .............. H01L 21/67742

FOREIGN PATENT DOCUMENTS

| JP | 2003-152060 A | 5/2003 |
| JP | 2017-212343 A | 11/2017 |
| JP | 2021141212 A * | 9/2021 |

OTHER PUBLICATIONS

Japan Patent Office, Office Action (Notice of Reasons for Refusal) issued in corresponding Application No. 2022-163652 issued Nov. 4, 2025.  
Japan Patent Office, Office Action (Decision of Refusal) issued in corresponding Application No. JP 2022-163652 issued Mar. 10, 2026.

* cited by examiner

*Primary Examiner* — Tyrone V Hall, Jr.  
(74) *Attorney, Agent, or Firm* — Stites & Harbison, PLLC; Jeffrey A. Haeberlin; Collin M. Aycock

(57) ABSTRACT

A substrate holding member includes a flat-plate-shaped base body that has at least one vent hole and a grooved portion, the at least one vent hole opening in an upper surface, the grooved portion communicating with the at least one vent hole and opening in a lower surface; a plurality of upper-surface convex portions that are formed so as to protrude upward from the upper surface of the base body; and an upper-surface ring-shaped convex portion that is formed in a ring shape along an outer periphery of the upper surface of the base body so as to protrude upward from the upper surface, wherein a cross-sectional area of the grooved portion in a direction perpendicular to a flow path direction is 1.2 mm² or greater.

14 Claims, 8 Drawing Sheets

WIDTH W OF
GROOVED PORTION

18

WIDTH W OF
GROOVED PORTION

32

16

ROW ROW

18

WIDTH W OF
GROOVED PORTION

32

16

ROW ROW

FIG. 10

| | WIDTH OF GROOVED PORTION (mm) | DEPTH OF GROOVED PORTION (mm) | CROSS-SECTIONAL AREA OF GROOVED PORTION (mm²) | EXISTENCE OR NONEXISTENCE OF FIRST LOWER-SURFACE CONVEX PORTION | SUBSTRATE HAVING 0.4-mm CURVE | | SUBSTRATE HAVING 0.8-mm CURVE | |
|---|---|---|---|---|---|---|---|---|
| | | | | | EVALUATION OF ATTRACTION | FLATNESS | EVALUATION OF ATTRACTION | FLATNESS |
| EXAMPLE 1 | 2.0 | 0.6 | 1.20 | DOES NOT EXIST | GOOD | GOOD | POOR | — |
| EXAMPLE 2 | 2.0 | 0.6 | 1.20 | EXISTS | GOOD | EXCELLENT | POOR | — |
| EXAMPLE 3 | 2.0 | 0.6 | 1.20 | EXISTS | GOOD | EXCELLENT | POOR | — |
| EXAMPLE 4 | 3.2 | 0.6 | 1.92 | EXISTS | GOOD | EXCELLENT | GOOD | EXCELLENT |
| EXAMPLE 5 | 4.1 | 0.6 | 2.46 | EXISTS | GOOD | GOOD | GOOD | GOOD |
| COMPARATIVE EXAMPLE 1 | 1.6 | 0.6 | 0.96 | DOES NOT EXIST | POOR | — | POOR | — |

SUBSTRATE HOLDING MEMBER

BACKGROUND OF THE INVENTION

1. Field of the Invention

The present invention relates to a substrate holding member that attracts and holds a substrate.

2. Description of the Related Art

Hitherto, in, for example, a semiconductor manufacturing apparatus, a substrate holding member that supports a substrate, such as a silicon wafer or a glass substrate, has been used.

Patent Literature 1 discloses a substrate holding device that includes a silicon wafer, a chuck table, a vacuum chuck, a vacuum pump, a vacuum path, and a valve. The chuck table has a vacuum path. Spaces are formed so as to be hermetically sealed by a lower surface of the silicon wafer, an upper surface of the vacuum chuck and an inner peripheral surface of an embankment portion, an upper surface of the chuck table, a lower surface of the vacuum chuck, an inner peripheral surface of the embankment portion, and an outer peripheral surface of the embankment portion. By reducing the pressure in these hermetically sealed spaces by the vacuum pump, the substrate holding device holds the silicon wafer and the vacuum chuck.

Patent Literature 2 discloses a substrate holding device in which a plurality of convex portions are formed on a flat-plate-shaped base body so as to protrude upward from an upper surface of the base body, the base body having a vent hole that opens in the upper surface, the base body has a groove that opens in a lower surface and that communicates with the vent hole, and a plurality of convex portions are formed so as to protrude in a downward direction of the groove.

CITATION LIST

Patent Literature

PTL 1: Japanese Unexamined Patent Application Publication No. 2003-152060

PTL 2: Japanese Unexamined Patent Application Publication No. 2017-212343

A substrate to be attracted is not necessarily flat, and may have a deformed shape as a result of, for example, being bent or curved, and thus even such a substrate needs to be attracted in the same way that a flat substrate is attracted. In recent years, requirement standards with respect to the flatness of a substrate have been raised and demands for attracting with good flatness a substrate that is relatively largely curved have been made. Accordingly, there has been room for improvement.

However, in the substrate holding devices in Patent Literature 1 and Patent Literature 2, a sufficient attraction force cannot be applied to such a substrate, as a result of which such substrate holding devices may not provide satisfactory solutions.

SUMMARY OF THE INVENTION

Accordingly, the present invention has been made in view of such circumstances, and it is an object of the present invention to provide a substrate holding member that is capable of attracting with good flatness even a bent or curved substrate.

To this end, in accordance with one aspect of the present invention, a substrate holding member includes a flat-plate-shaped base body that has at least one vent hole and a grooved portion, the at least one vent hole opening in an upper surface of the base body, the grooved portion communicating with the at least one vent hole and opening in a lower surface of the base body; a plurality of upper-surface convex portions that are formed so as to protrude upward from the upper surface of the base body; and an upper-surface ring-shaped convex portion that is formed in a ring shape along an outer periphery of the upper surface of the base body so as to protrude upward from the upper surface, wherein a cross-sectional area of the grooved portion in a direction perpendicular to a flow path direction is 1.2 mm$^2$ or greater.

When the cross-sectional area of the grooved portion in the direction perpendicular to the flow path direction is 1.2 mm$^2$ or greater, the pressure loss of the flow path is reduced and the negative pressure for attracting a substrate is increased, as a result of which it is possible to attract with good flatness even a largely curved substrate and to suppress occurrence of variations in, for example, positional displacements.

The substrate holding member of the present invention may further include a plurality of first lower-surface convex portions that are formed so as to protrude downward from an upper end surface of the grooved portion.

Due to this structure, deformation of the base body into a concave shape caused by a grooved portion having a large cross-sectional area is suppressed, and thus deformation of a substrate that is held by the base body is also suppressed.

In the substrate holding member of the present invention, the first lower-surface convex portions may be arranged when W/2 is 1.0 mm or greater, where W is a width of the grooved portion.

In this way, by determining whether or not to arrange the first lower-surface convex portions in accordance with the width of the grooved portion, it is possible to suppress deformation of the base body into a concave shape and to sufficiently reduce the effects of pressure loss caused by the formation of the first lower-surface convex portions.

The substrate holding member of the present invention may further include a first lower-surface ring-shaped convex portion that is formed so as to protrude downward from the lower surface of the base body in such a manner as to surround the grooved portion along an edge of the grooved portion; a second lower-surface ring-shaped convex portion that is formed so as to protrude downward from the lower surface of the base body in such a manner as to surround the first lower-surface ring-shaped convex portion; and a plurality of second lower-surface convex portions that are arranged in at least a region between the first lower-surface ring-shaped convex portion and the second lower-surface ring-shaped convex portion, and that are formed so as to protrude downward from the lower surface of the base body.

Due to such a structure, it is possible to decrease the contact area between the substrate holding member and a stage and to suppress a reduction in the flatness caused by introduction of, for example, particles.

BRIEF DESCRIPTION OF THE DRAWINGS

FIG. 10 shows a table of the conditions and evaluation results of grooved portions of examples and grooved portions of a comparative example.

DETAILED DESCRIPTION OF EXEMPLARY EMBODIMENTS OF THE INVENTION

Figure 1:
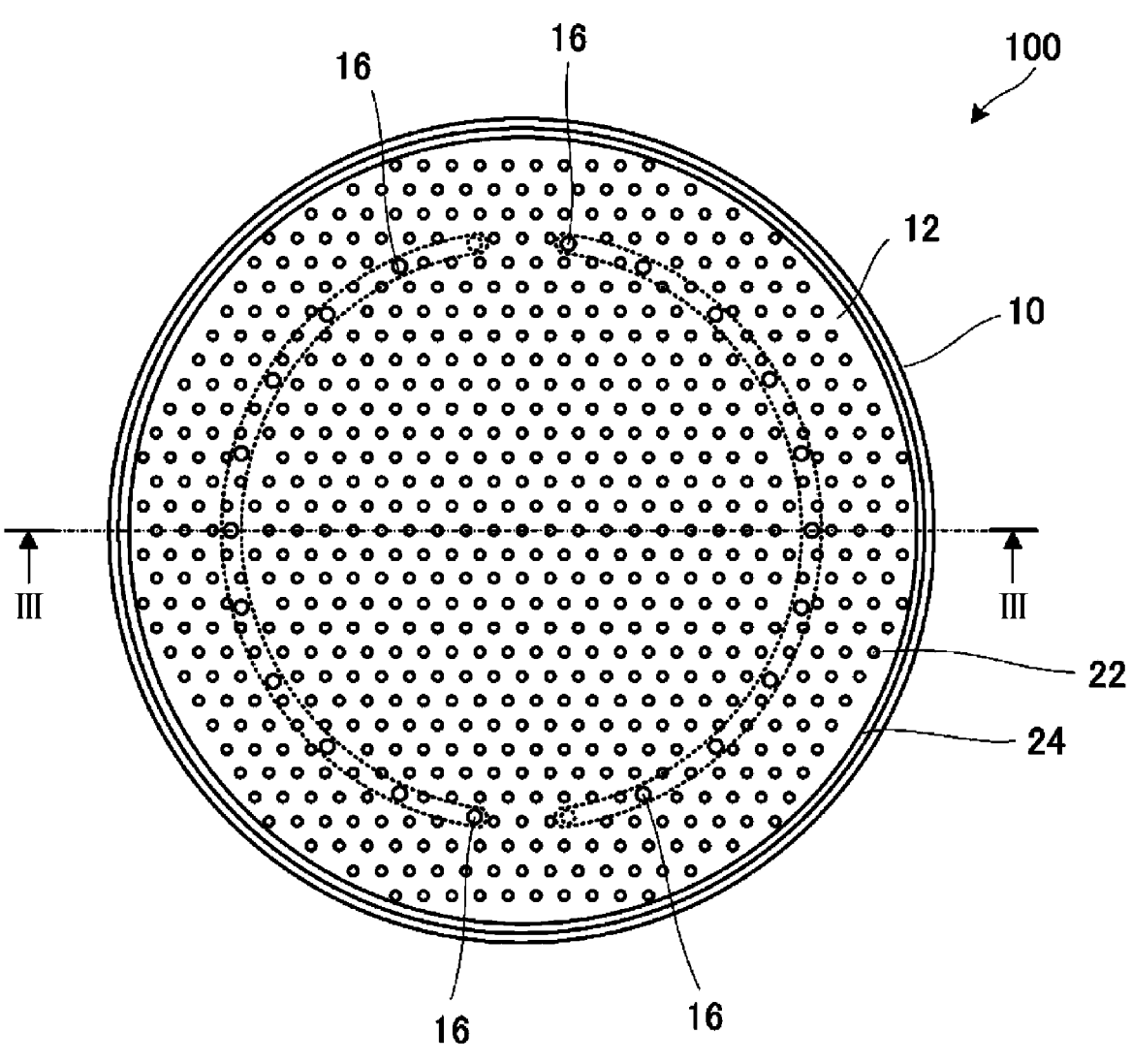
FIG. 1 is a schematic view showing an example of an upper surface of a substrate holding member according to an embodiment of the present invention.

Next, an embodiment of the present invention is described with reference to the drawings. To facilitate understanding of the description, the same reference numerals are given to structural elements that are the same in the figures, and the same descriptions of such structural elements are not repeated. Note that, in the structural figures, the size of each structural element is conceptually indicated and does not necessarily indicate the actual dimensional ratio.

Embodiment

Figure 2:
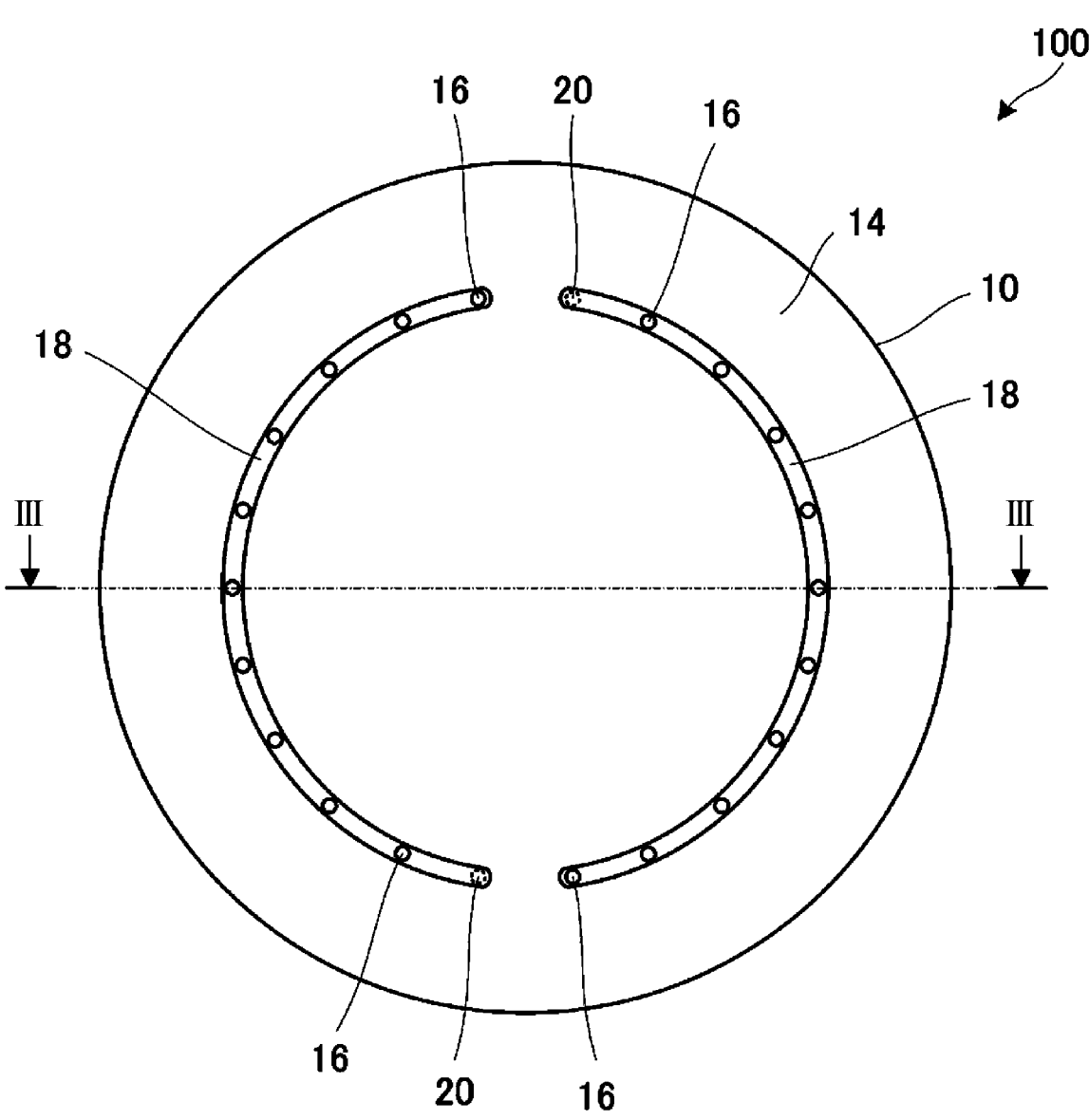
FIG. 2 is a schematic view showing an example of a lower surface of the substrate holding member according to the embodiment of the present invention.
Figure 3:
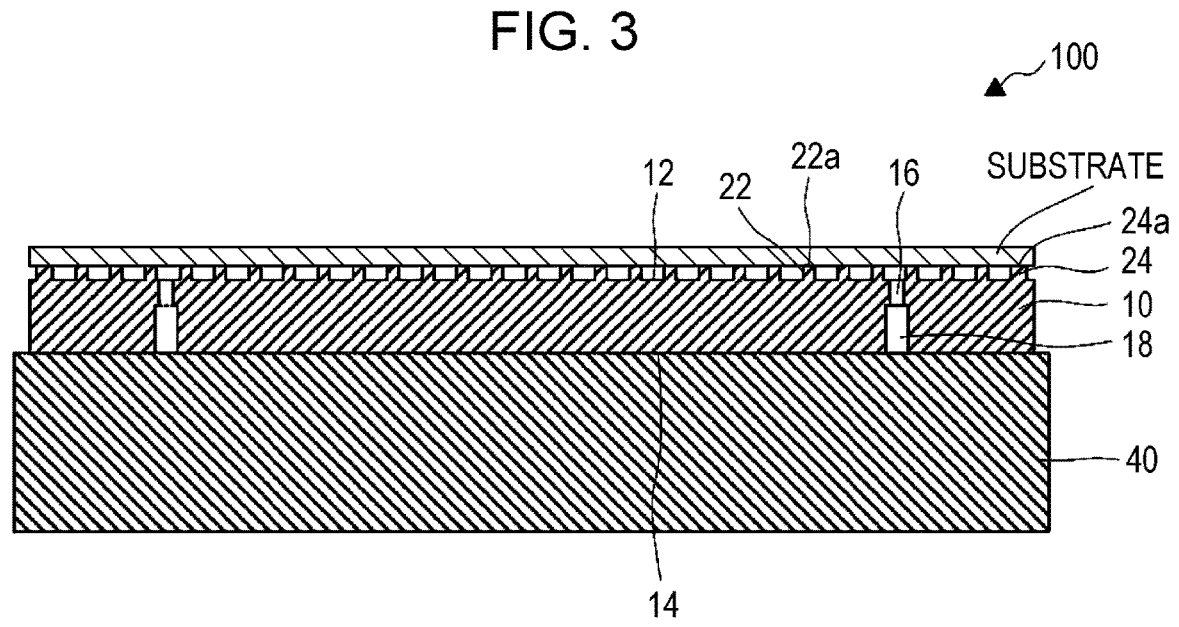
FIG. 3 is a cross-sectional view of the substrate holding member in a cross section along line III-III in FIGS. 1 and 2.

A substrate holding member according to an embodiment of the present invention is described with reference to FIGS. 1 to 3. FIG. 1 is a schematic view showing an example of an upper surface of the substrate holding member according to the embodiment of the present invention. FIG. 2 is a schematic view showing an example of a lower surface of the substrate holding member according to the embodiment of the present invention. FIG. 3 is a cross-sectional view of the substrate holding member in a cross section along line III-III in FIGS. 1 and 2. FIG. 3 also shows a stage 40 on which a substrate holding member 100 is placed and a placed substrate.

The substrate holding member 100 includes a base body 10 for attracting and holding a substrate (wafer). The base body 10 is formed from a ceramic sintered body formed into a substantially flat-plate shape. The base body 10, in addition to having a substantially disk shape, may have various other shapes, such as a polygonal plate shape or an elliptical plate shape. The thickness of the base body 10, excluding convex portions and groove portions (which are described later), is preferably 1.0 mm to 3.0 mm.

The base body 10 has at least one vent hole 16 that opens in an upper surface 12. The vent holes 16 communicate with grooved portions 18 that open in a lower surface 14. The vent holes 16 and the grooved portions 18 may communicate with each other through a vent path passing the inside of the base body 10. The grooved portions 18 are such that a suction hole (not shown) of a stage 40 is connected to a connection portion 20, and are connected to a vacuum suction device (not shown) through the connection portion 20. The width or the diameter of each vent hole 16 is preferably 0.5 mm to 2.0 mm.

As shown in FIGS. 1 to 3, 20 openings of the vent holes 16 exist in the upper surface 12 of the base body 10 and are arranged in a ring shape. However, the number of the openings of the vent holes 16 and the arrangement of the openings of the vent holes 16 are not limited thereto. For example, the openings of the vent holes 16 may be positioned at the center of the base body 10.

By forming the grooved portions 18 that are in the form of a line in the base body 10, a system that attracts a substrate to the substrate holding member 100 and a system that attracts the substrate holding member 100 to the stage 40 can be separated from each other. This makes it possible to reduce bending or positional displacement of a substrate surface after the attraction.

Although, as shown in FIGS. 1 to 3, the grooved portions 18 are two arc-shaped grooved portions that are formed in a peripheral direction of the base body 10, the number of grooved portions 18 may be one or three or more. The arrangement and shape of the grooved portions 18 may be a linear arrangement and shape extending in a radial direction from near the center of the base body 10 or an arc arrangement and shape extending in a peripheral direction. In addition, the arrangement and shape of the grooved portions 18 may be other linear arrangements and shapes, a curved arrangement and shape, or a combination thereof. The grooved portions 18 may be branched at intermediate portions thereof.

The cross-sectional area of each grooved portion 18 in a direction perpendicular to a flow path direction is 1.2 mm$^2$ or greater. The cross-sectional area of each grooved portion 18 in the direction perpendicular to the flow path direction is preferably 1.8 mm$^2$ or greater. In this way, when the cross-sectional area of each grooved portion 18 in the direction perpendicular to the flow path direction is 1.2 mm$^2$ or greater, the pressure loss of the flow path is reduced and the negative pressure for attracting a substrate is increased, as a result of which it is possible to attract with good flatness even a largely bent or curved substrate and to suppress occurrence of variations in, for example, positional displacements.

Figure 4:
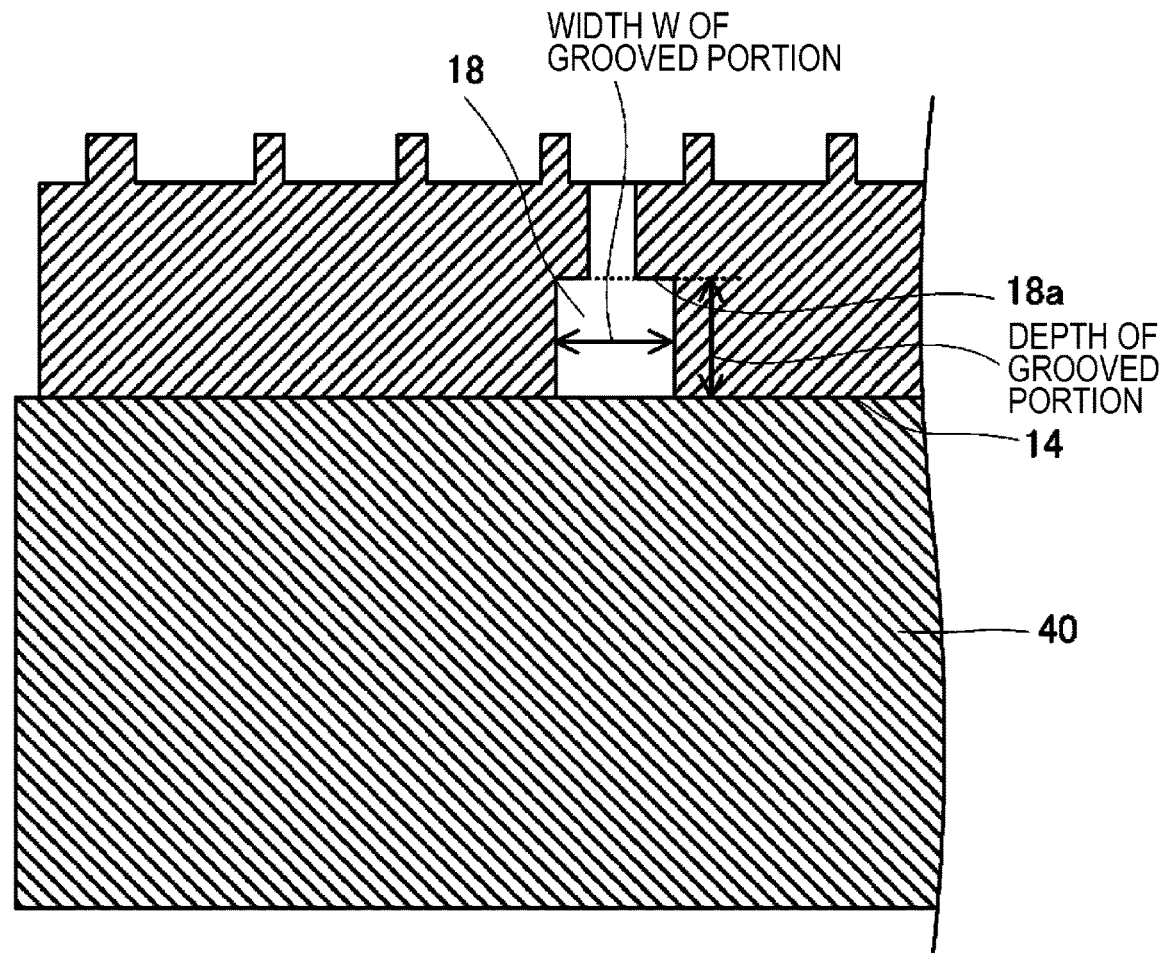
FIG. 4 is a partial enlarged view of FIG. 3.

FIG. 4 is a partial enlarged view of FIG. 3. For example, as shown in FIG. 4, when the lower surface 14 of the base body 10 and an upper surface of the stage 40 contact each other and when a cross section of a grooved portion 18 in the direction perpendicular to the flow path direction has a substantially rectangular shape, the cross-sectional area of the grooved portion 18 in the direction perpendicular to the flow path direction can be calculated by a width W of the grooved portion 18 and a depth of the grooved portion 18. When the cross-sectional shape of the grooved portion 18 in the direction perpendicular to the flow path direction is a shape other than a rectangular shape, the area of a cross section of a space surrounded by an upper end surface 18a of the grooved portion, a side surface of the grooved portion 18, and the upper surface of the stage 40 is the cross-sectional area of the grooved portion 18.

Each grooved portion 18 is preferably designed such that its depth is included in a range of ratio of 0.4 to 0.6 with respect to the thickness of the base body 10. For example, when the thickness of the base body 10 is 1 mm, each grooved portion 18 is preferably designed such that its depth is included in the range of 0.4 mm to 0.6 mm. When each grooved portion 18 is shallower than aforementioned range, it may be difficult to provide a negative pressure that allows a bent or curved substrate to be sufficiently attracted. On the other hand, when each grooved portion 18 is deep, the strength of the base body 10 is reduced and thus the risk of damaging the base body 10 is increased. Therefore, each grooved portion 18 is preferably designed such that its depth is included in the aforementioned range. The depth of each grooved portion 18, excluding the connection portion 20 and the like, is preferably a certain value.

In order to set the cross-sectional area of each grooved portion 18 to a value such as that mentioned above, the width W of each grooved portion 18 is preferably adjusted. The width W of each grooved portion 18 is preferably 1.7 mm to 4.0 mm, and is more preferably 2.0 mm to 3.5 mm. When the width W of each grooved portion 18 is smaller than this range, the target cross-sectional area cannot be realized when combining the width W of each grooved portion 18 with the aforementioned preferable depth of each grooved portion 18, as a result of which it may be difficult to provide a negative pressure that allows a bent or curved substrate to be sufficiently attracted. On the other hand, when the width W of each grooved portion 18 is too large, the strength of the base body 10 is reduced due to an increase in the volume of a thin-walled portion, and thus the risk of damaging the base body 10 is increased. Therefore, the cross-sectional area of each grooved portion 18 is preferably 2.8 mm² or less. The width W of each grooved portion 18, excluding an end portion or a branching portion, is preferably a certain value. A ratio of an area of an opening portion of each grooved portion 18 with respect to the area of the lower surface 14 of the base body 10 in plan view differs depending upon the width W and the length of each grooved portion 18, the number of vent holes 16, and the arrangement of the vent holes 16. However, the ratio is preferably, for example, 1% or greater, and is more preferably, for example, 3% or greater. In addition, the ratio of the area of the opening portion of each grooved portion 18 with respect to the area of the lower surface 14 of the base body 10 in plan view is preferably, for example, 20% or less, and is more preferably, for example, 10% or less. This is because, when there are too many grooved portions 18, the flatness of a substrate may be reduced.

A plurality of upper-surface convex portions 22 are formed on the base body 10 so as to protrude upward from the upper surface 12 of the base body 10. The plurality of upper-surface convex portions 22 support a substrate. Upper ends 22a (points or surfaces of top portions) of the plurality of upper-surface convex portions are formed to be substantially flush with each other. Therefore, the upper ends 22a of the upper-surface convex portions contact the substrate and support the substrate. Note that, of the plurality of upper-surface convex portions 22, there may be an upper-surface convex portion 22 whose upper end does not contact the substrate. This is because, even if such a convex portion exists, the substrate can be supported depending upon the arrangement of the upper-surface convex portions 22 surrounding such a convex portion. Note that, although in FIG. 3, the entire upper ends 22a of the upper-surface convex portions contact the substrate, only a part of the upper ends 22a of the upper-surface convex portions may contact the substrate.

The shape of each upper-surface convex portion 22 may be, for example, a circular columnar shape, a rectangular columnar shape, a conical trapezoidal shape, or a pyramidal trapezoidal shape, or the shape of each upper-surface convex portion 22 may be a stepped shape whose upper portion has a cross-sectional area that is smaller than the cross-sectional area of its lower portion. The upper-surface convex portions 22 may each have a steep-sided conical trapezoidal shape having a high aspect ratio. The upper-surface convex portions 22 can each be formed by, for example, blast processing, laser processing, or a combination thereof.

The upper-surface convex portions 22 may be regularly arranged in a triangular lattice arrangement, a rectangular lattice arrangement, or a concentrically circular arrangement, or may be irregularly arranged with locally high or low density. The height of each upper-surface convex portion 22 is preferably 50 μm to 200 μm. Note that the height of each upper-surface convex portion 22 refers to the distance from the upper surface 12 to the upper end 22a of the upper-surface convex portion corresponding thereto. The maximum diameter of the upper end 22a of each upper-surface convex portion 22 is preferably 500 μm or less. The interval between adjacent upper-surface convex portions 22 is such that a center-to-center distance is preferably 8 mm or less.

An upper-surface ring-shaped convex portion 24 is formed in a ring shape on the base body 10 along an outer periphery of the upper surface 12 of the base body 10 so as to protrude upward from the upper surface 12. The upper-surface ring-shaped convex portion 24 surrounds the plurality of upper-surface convex portions 22. In FIG. 1, the upper-surface ring-shaped convex portion 24 is continuously formed in the ring shape when seen from thereabove toward a slightly central side from an outer peripheral surface of the base body 10. A part of the upper-surface convex portions 22 may be disposed on an outer side of the upper-surface ring-shaped convex portion 24. An upper end surface 24a of the upper-surface ring-shaped convex portion may be formed closer to the upper surface 12 of the base body 10 than the upper end 22a of each upper-surface convex portion. That is, the height of the upper-surface ring-shaped convex portion 24 may be smaller than the height of each upper-surface convex portion 22. Here, the height of the upper-surface ring-shaped convex portion 24 is preferably smaller than the height of each upper-surface convex portion 22 by 1 μm to 5 μm. Therefore, since the contact area between the base body 10 and the substrate is decreased, it is possible to reduce the risk of a reduction in profile irregularity caused by production of particles and introduction of the particles. The height of the upper-surface ring-shaped convex portion 24 and the height of each upper-surface convex portion 22 may have a relationship in which the upper-surface ring-shaped convex portion 24 is substantially flush with each upper-surface convex portion 22. When the upper-surface ring-shaped convex portion 24 is substantially flush with the plurality of upper-surface convex portions 22, a negative-pressure space is brought into a hermetically sealed state, as a result of which a suction force is increased. Therefore, it is possible to attract with good flatness even a largely bent or curved substrate.

Figure 5A:
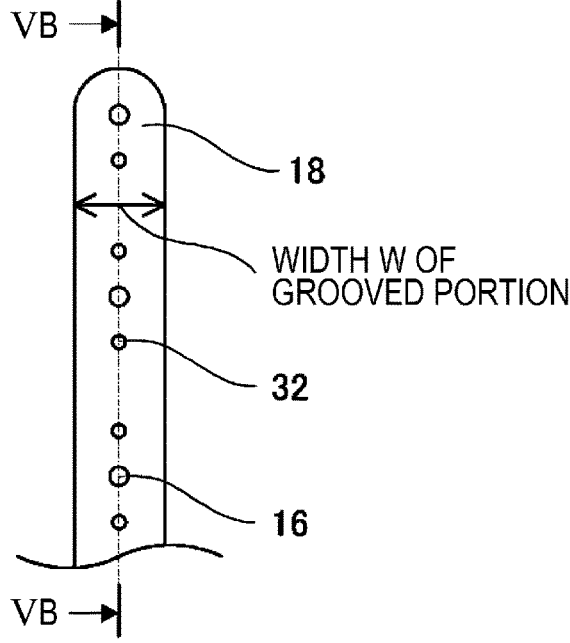
FIG. 5A is a partial schematic view showing a modification of a grooved portion in the lower surface of the substrate holding member according to the embodiment of the present invention.
Figure 5B:
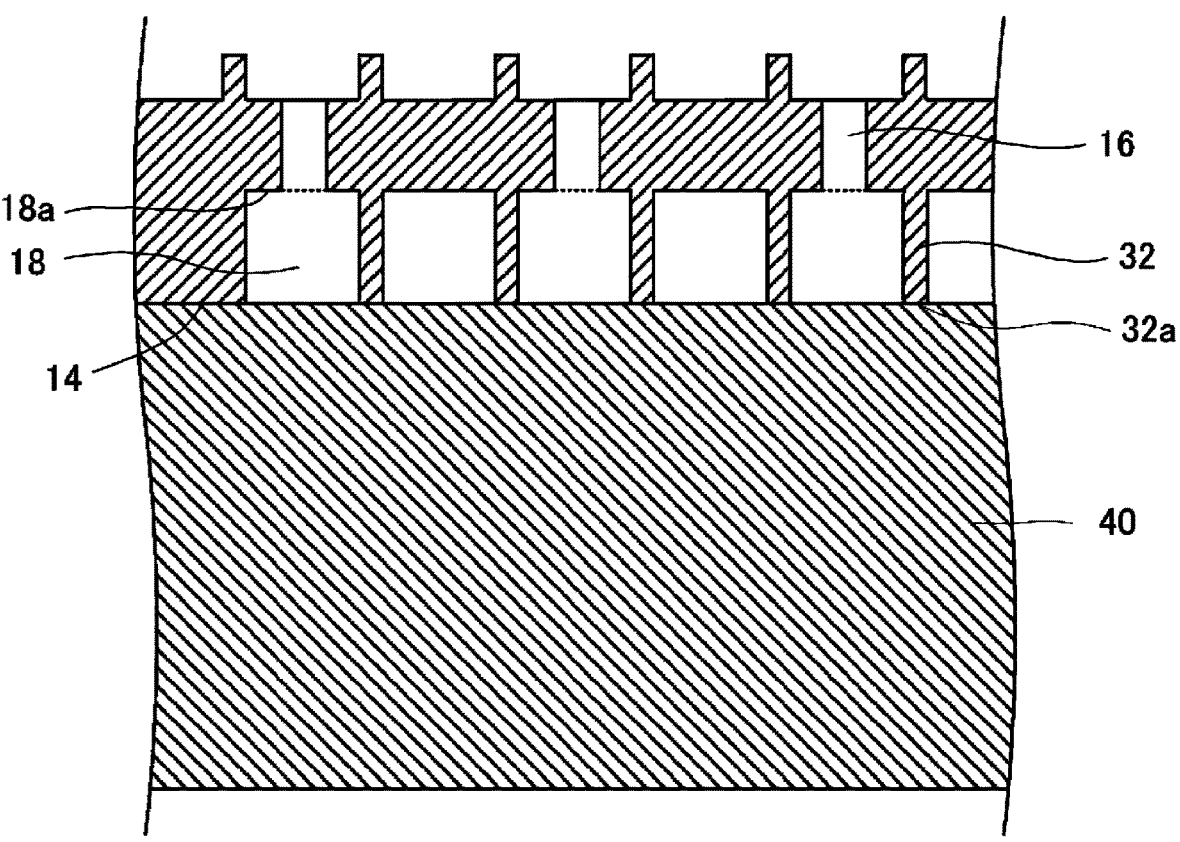
FIG. 5B is a partial cross-sectional view of the substrate holding member in a cross section along line VB-VB in FIG. 5A.

FIG. 5A is a partial schematic view showing a modification of a grooved portion in the lower surface of the substrate holding member according to the embodiment of the present invention. FIG. 5B is a partial cross-sectional view of the substrate holding member in a cross section along line VB-VB in FIG. 5A. As shown in FIGS. 5A and 5B, a plurality of first lower-surface convex portions 32 that are formed so as to protrude downward from the upper end surface 18a of the grooved portion are preferably formed inside the grooved portion 18. Here, lower ends 32a (points or surfaces of top portions) of the plurality of first lower-surface convex portions are preferably formed with heights that allow them to be substantially flush with the lower surface 14. Therefore, since the base body 10 and the stage 40 contact each other at and are supported by the first lower-surface convex portions 32 even in the grooved portion 18, it is possible to suppress local deformation of the base body 10 and to increase the flatness accuracy of the substrate. Note that, when a plurality of second lower-surface convex portions 34 (described below) are formed, lower ends 32a of the plurality of first lower-surface convex portions are preferably formed with heights that allow them to be substantially flush with lower ends 34a of the plurality of second lower-surface convex portions.

Each first lower-surface convex portion 32 preferably has a shape that does not hinder vacuum drawing inside each grooved portion 18. For example, the first lower-surface convex portions 32 each preferably have a steep-sided conical trapezoidal shape having a base angle of 70 degrees to 85 degrees and preferably 75 degrees to 80 degrees and having a high aspect ratio. Such first lower-surface convex portions 32 can be formed by laser processing. That is, the shape of each first lower-surface convex portion 32 is not limited to a conical trapezoidal shape and may be a circular columnar shape, a pyramidal shape, or other shapes. When the first lower-surface convex portions 32 are formed in each grooved portion 18, the width W of each grooved portion 18 is to be determined at locations where the first lower-surface convex portions 32 are not formed.

The first lower-surface convex portions 32 are preferably arranged when W/2 is 1.0 mm or greater, where W is the width of each grooved portion 18. That is, when the distance in a width W direction of each grooved portion 18 between a side surface of each grooved portion 18 and the center of each first lower-surface convex portion 32 corresponding thereto can be made 1.0 mm or greater, the first lower-surface convex portions 32 are preferably formed. In this way, by determining whether or not to arrange the first lower-surface convex portions 32 in accordance with the width of each grooved portion 18, it is possible to suppress deformation of the base body 10 into a concave shape and to sufficiently reduce the effects of pressure loss caused by the formation of the first lower-surface convex portions 32. In addition, the first lower-surface convex portions 32 are easily formed.

Figure 6A:
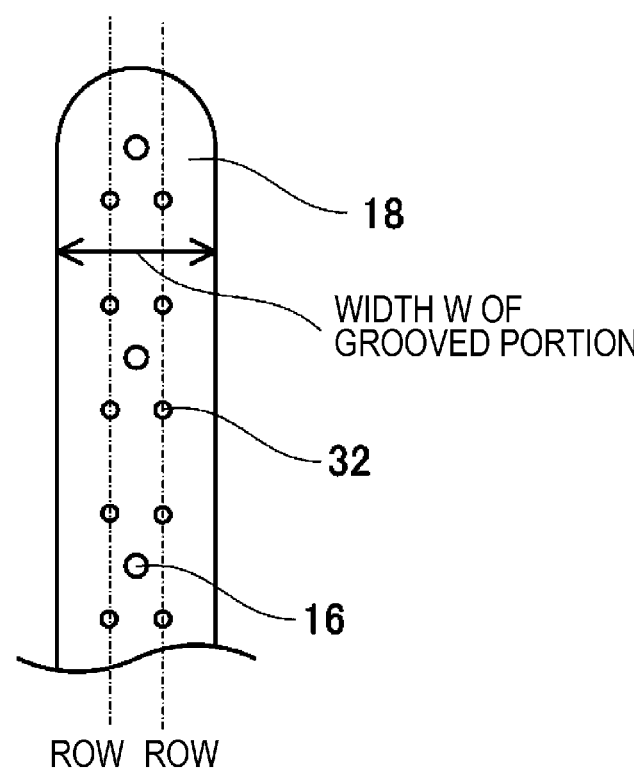
FIGS. 6A and 6B are each a partial schematic view showing a modification of a grooved portion in the lower surface of the substrate holding member according to the embodiment of the present invention.
Figure 6B:
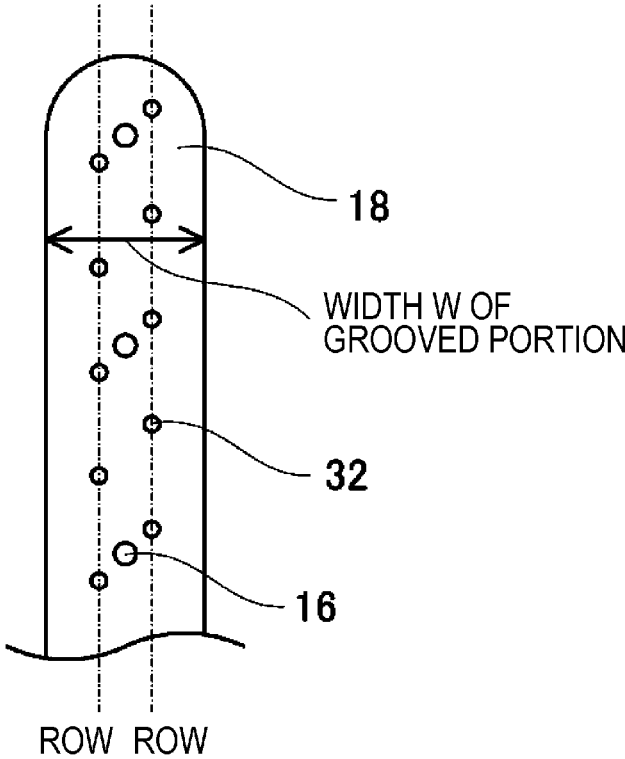

FIGS. 6A and 6B are each a partial schematic view showing a modification of a grooved portion in the lower surface of the substrate holding member according to the embodiment of the present invention. As shown in FIG. 6A or FIG. 6B, when the width W of a grooved portion 18 is sufficiently large, two or more rows of the first lower-surface convex portions 32 may be formed inside the grooved portion 18. When the first lower-surface convex portions 32 are formed in two or more rows, as shown in FIG. 6A, the first lower-surface convex portions 32 may be arranged side by side in the width W direction of the grooved portion 18, or, as shown in FIG. 6B, the first lower-surface convex portions 32 may not be arranged side by side in the width W direction of the grooved portion 18. Note that, although, in FIG. 5A or FIGS. 6A and 6B, the first lower-surface convex portions 32 are arranged in rows in a central-line direction of the grooved portion 18, the first lower-surface convex portions 32 may be arranged based on the arrangement of the second lower-surface convex portions 34 (described later), or may be randomly arranged.

Figure 7:
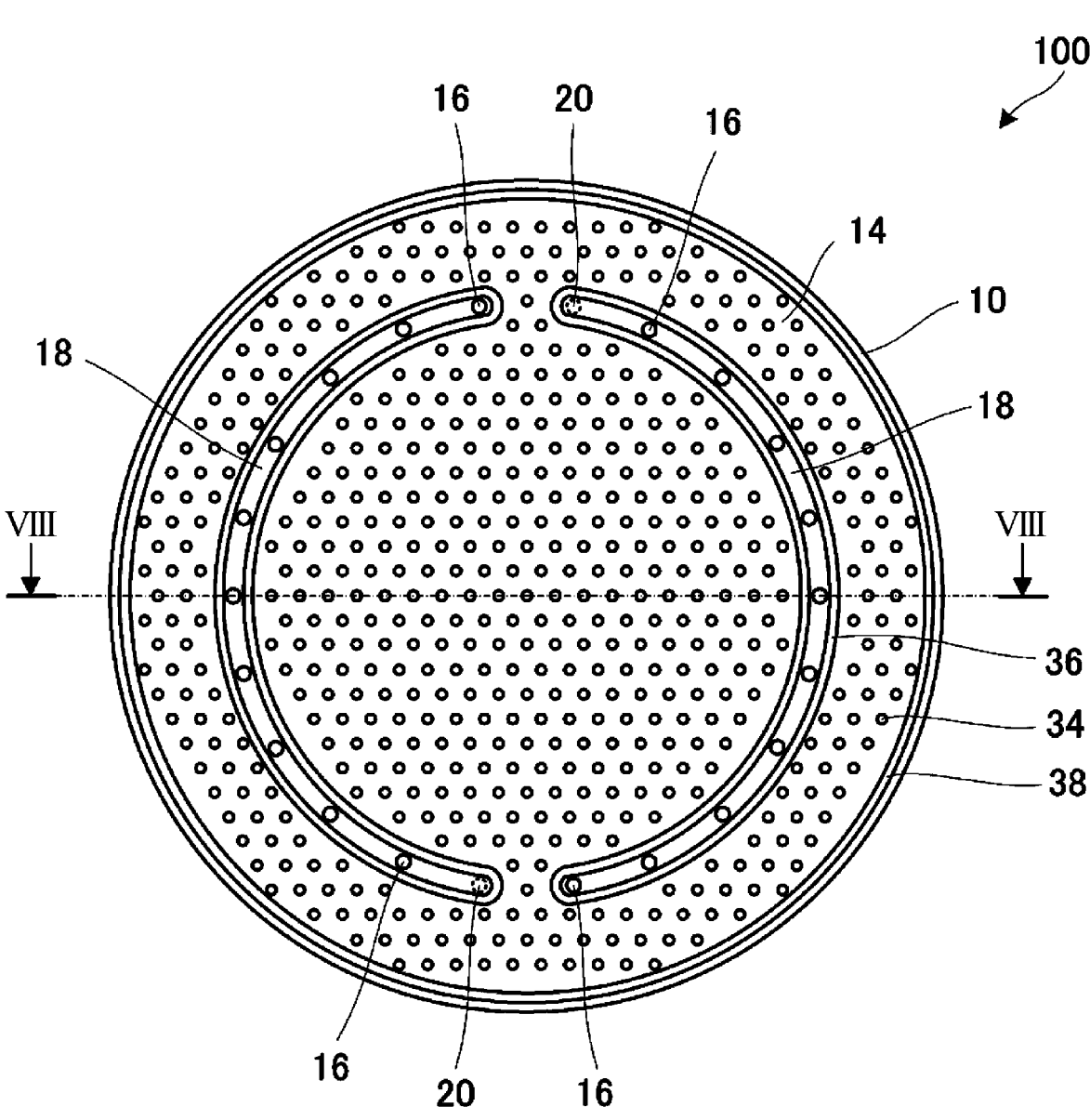
FIG. 7 is a schematic view showing an example of a lower surface of the substrate holding member according to a modification of the embodiment of the present invention.
Figure 8:
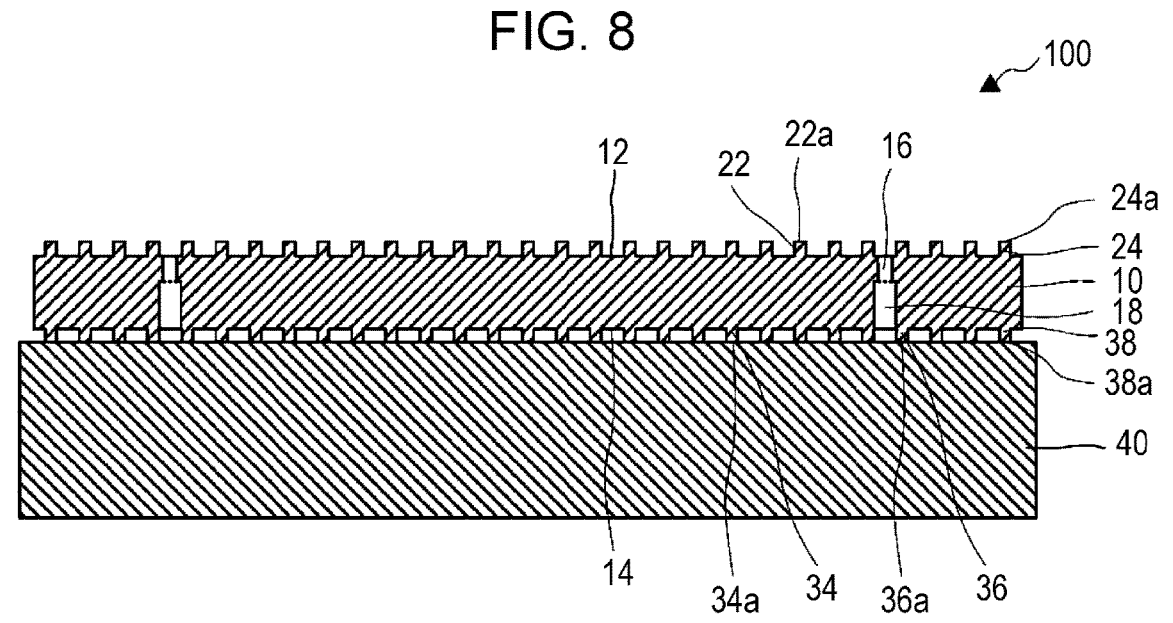
FIG. 8 is a cross-sectional view of the substrate holding member in a cross section along line VIII-VIII in FIG. 7.

FIG. 7 is a schematic view showing a modification of a lower surface of the substrate holding member according to the embodiment of the present invention. FIG. 8 is a cross-sectional view of the substrate holding member in a cross section along line VIII-VIII in FIG. 7. FIG. 8 also shows the stage 40 on which the substrate holding member 100 is placed.

As shown in FIG. 7 or FIG. 8, the plurality of second lower-surface convex portions 34 are preferably formed on the base body 10 so as to protrude downward from the lower surface 14 of the base body 10. The lower ends 34a (points or surfaces of top portions) of the plurality of second lower-surface convex portions are formed to be substantially flush with each other. Therefore, the lower ends 34a of the second lower-surface convex portions contact the upper surface of stage 40, and the substrate holding member 100 is supported on the stage 40. Note that, of the plurality of second lower-surface convex portions 34, there may be a second lower-surface convex portion 34 whose lower end does not contact the stage 40. This is because, even if such a convex portion exists, the substrate holding member 100 can be supported depending upon the arrangement of the second lower-surface convex portions 34 surrounding such a convex portion. Note that, although in FIG. 8, the entire lower ends 34a of the second lower-surface convex portions contact the stage 40, only a part of the lower ends 34a of the second lower-surface convex portions may contact the stage 40.

The shape of each second lower-surface convex portion 34 may be, for example, a circular columnar shape, a rectangular columnar shape, a conical trapezoidal shape, or a pyramidal trapezoidal shape, or the shape of each second lower-surface convex portion 34 may be a stepped shape whose front end side has a cross-sectional area that is smaller than the cross-sectional area of its base-body-10 lower-surface-14 side. The second lower-surface convex portions 34 may each have a steep-sided conical trapezoidal shape having a high aspect ratio. The second lower-surface convex portions 34 can each be formed by, for example, blast processing, laser processing, or a combination thereof.

The second lower-surface convex portions 34 may be regularly arranged in a triangular lattice arrangement, a rectangular lattice arrangement, or a concentrically circular arrangement, or may be irregularly arranged with locally high or low density. The height of each second lower-surface convex portion 34 is preferably 50 μm to 200 μm. Note that the height of each second lower-surface convex portion 34 refers to the distance from the lower surface 14 of the base body 10 to the lower end 34a of the second lower-surface convex portion corresponding thereto. The maximum diameter of the lower end 34a of each second lower-surface convex portion is preferably 500 μm or less. The interval between adjacent second lower-surface convex portions 34 is such that a center-to-center distance is preferably 8 mm or less.

When the second lower-surface convex portions 34 are to be formed, each first lower-surface ring-shaped convex portion 36 is preferably formed on the base body 10 so as to protrude downward from the lower surface 14 of the base body 10 in such a manner as to surround a corresponding one of the grooved portions 18 along an edge of the corresponding one of the grooved portions 18. In FIG. 7, each first lower-surface ring-shaped convex portion 36 is continuously formed in a ring shape along an edge of a substantially arc-shaped opening of the grooved portion 18 corresponding thereto such that end portions thereof are rounded when seen from therebelow. When the grooved portions 18 have corners, corners corresponding to the second lower-surface convex portions 34 are preferably rounded. Although each first lower-surface ring-shaped convex portion 36 is basically formed along the edge of the grooved portion 18 corresponding thereto, each first lower-surface ring-shaped convex portion 36 can be formed with various other shapes in accordance with, for example, the shape of the grooved portion 18 corresponding thereto or the shape of the vent holes 16, and a part of each first lower-surface ring-shaped convex portion 36 need not be formed along the edge of the grooved portion 18 corresponding thereto. For example, a part of each first lower-surface ring-shaped convex portion 36 corresponding to the connection portion 20 where the grooved portion 18 is connected to a vacuum suction device at the stage 40 may be formed with a shape that is in correspondence with the shape of the connection portion of the vacuum suction device at the stage 40. The width of each first lower-surface ring-shaped convex portion 36 is preferably 0.2 mm to 0.5 mm.

A lower end surface 36a of each first lower-surface ring-shaped convex portion may be formed at a location that is closer to the lower surface 14 of the base body 10 than the lower end 34a of each second lower-surface convex portion. That is, the height of each first lower-surface ring-shaped convex portion 36 may be smaller than the height of each second lower-surface convex portion 34. Here, the height of each first lower-surface ring-shaped convex portion 36 is preferably smaller than the height of each second lower-surface convex portion 34 by 1 µm to 5 µm. Therefore, it is possible to reduce the risk of a decrease in flatness caused by introduction of particles. Here, each first lower-surface ring-shaped convex portion 36 may be formed in such a manner as to surround the grooved portions 18 in two or more layers. This makes it possible to reduce pressure loss inside each grooved portion 18. The height of each first lower-surface ring-shaped convex portion 36 and the height of each second lower-surface convex portion 34 may have a relationship in which each first lower-surface ring-shaped convex portion 36 is substantially flush with each second lower-surface convex portion 34. When each first lower-surface ring-shaped convex portion 36 is substantially flush with the plurality of second lower-surface convex portions 34, a negative-pressure space inside each grooved portion 18 is brought into a hermetically sealed state, as a result of which a suction force is increased. Therefore, it is possible to attract with good flatness even a largely bent or curved substrate.

Figure 9:
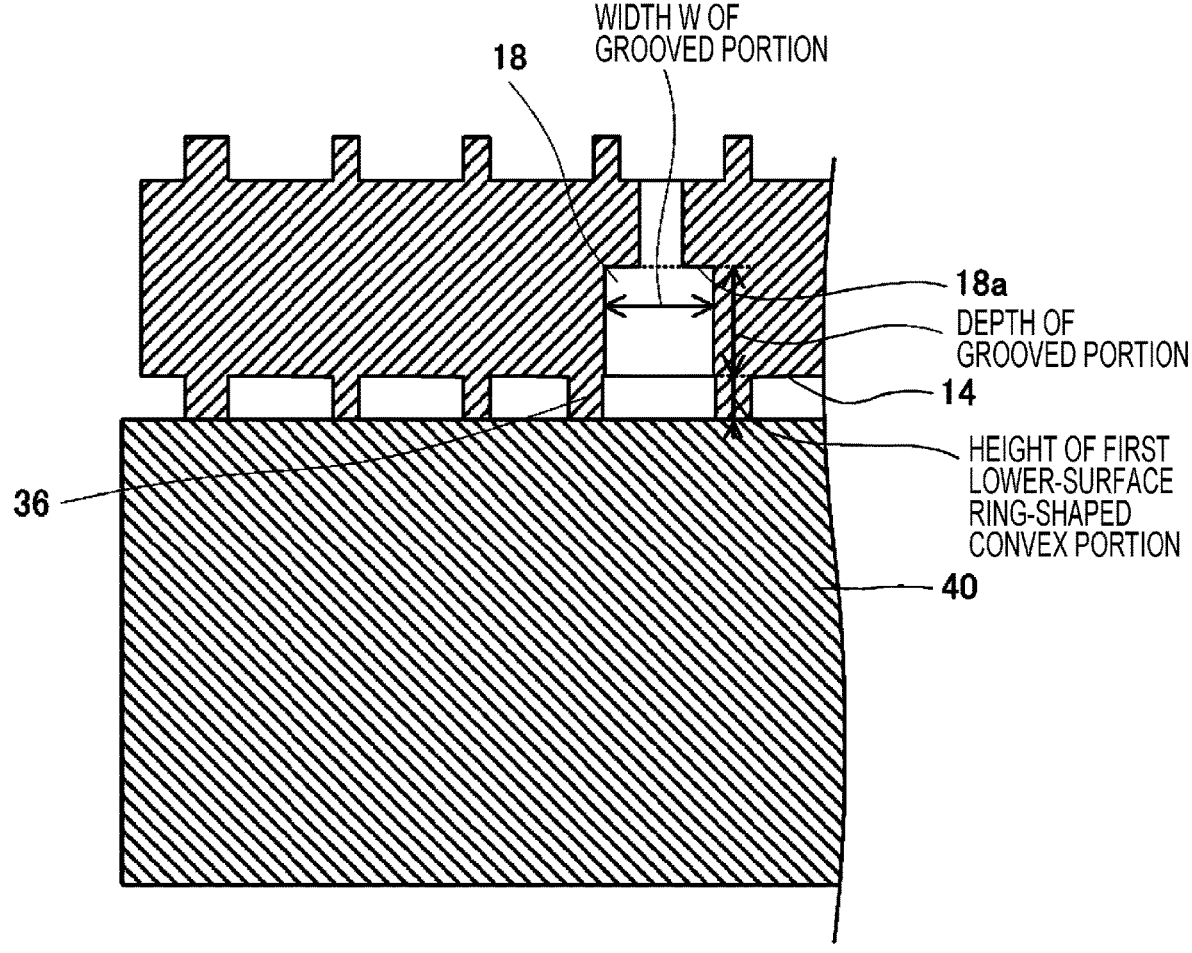
FIG. 9 is a partial enlarged view of FIG. 8.

FIG. 9 is a partial enlarged view of FIG. 8. For example, as shown in FIG. 9, when the second lower-surface convex portions 34 and the first lower-surface ring-shaped convex portions 36 are formed on the lower surface 14 of the base body 10, the area of a cross section of a space surrounded by the upper end surface 18a of the grooved portions, side surfaces of the grooved portions 18, side surfaces of the first lower-surface ring-shaped convex portions, and the upper surface of the stage 40 is the cross-sectional area of the grooved portions 18. Here, even if the lower end surface 36a of each first lower-surface ring-shaped convex portion does not contact the upper surface of the stage 40, the length from the lower surface 14 of the base body 10 to the upper surface of the stage 40 is considered as the length of the side surface of each first lower-surface ring-shaped convex portion for determining the cross-sectional area of each grooved portion 18. This is because the purpose is to determine the cross-sectional area of a portion that essentially becomes a flow path.

When the second lower-surface convex portions 34 are to be formed, a second lower-surface ring-shaped convex portion 38 that surrounds the second lower-surface convex portions 34 is preferably formed so as to protrude downward from the lower surface 14 of the base body 10. In FIG. 7, the second lower-surface ring-shaped convex portion 38 is continuously formed in a ring shape when seen from therebelow toward a slightly central side from the outer peripheral surface of the base body 10. A part of the second lower-surface convex portions 34 may be arranged on an outer side of the second lower-surface ring-shaped convex portion 38.

A lower end surface 38a of the second lower-surface ring-shaped convex portion may be formed at a location that is closer to the lower surface 14 of the base body 10 than the lower end 34a of each second lower-surface convex portion. That is, the height of the second lower-surface ring-shaped convex portion 38 may be smaller than the height of each second lower-surface convex portion 34. Here, the height of the second lower-surface ring-shaped convex portion 38 is preferably smaller than the height of each second lower-surface convex portion 34 by 1 µm to 5 µm. Therefore, since the contact area between the base body 10 and the stage 40 is decreased, it is possible to reduce the risk of a decrease in surface accuracy caused by production of particles and introduction of the particles. The height of the second lower-surface ring-shaped convex portion 38 and the height of each second lower-surface convex portion 34 may have a relationship in which the second lower-surface ring-shaped convex portion 38 is substantially flush with each second lower-surface convex portion 34. When the second lower-surface ring-shaped convex portion 38 is substantially flush with the plurality of second lower-surface convex portions 34, a negative-pressure space inside the lower surface 14 of the base body 10 is brought into a hermetically sealed state, as a result of which a suction force for attracting the base body 10 to the stage 40 is increased and positional displacement of the substrate holding member 100 can be prevented.

The lower end surface 36a of each first lower-surface ring-shaped convex portion and the lower end surface 38a of the second lower-surface ring-shaped convex portion may form the same surface or may form different surfaces. That is, each first lower-surface ring-shaped convex portion 36 and the second lower-surface ring-shaped convex portion 38 may have the same height or may have different heights. However, the lower end surface 36a of each first lower-surface ring-shaped convex portion and the lower end surface 38a of the second lower-surface ring-shaped convex portion are preferably substantially flush with each other.

Method of Manufacturing Substrate Holding Member

By performing a well-known method, a disk-shaped molded product is formed from raw-material powder, and the molded product is subjected to firing to thereby obtain a ceramic sintered body. Although the substrate holding member of the present invention is formed with a flat-plate disk shape due to the ceramic sintered body, the substrate holding member may have a polygonal shape, an elliptical shape, or any other shape. For the ceramic sintered body, for example, silicon carbide, aluminum oxide, silicon nitride, or aluminum nitride is used.

In accordance with the design of a substrate holding member, a plurality of convex portions (upper-surface convex portions, first lower-surface convex portions, second lower-surface convex portions), ring-shaped convex portions (upper-surface ring-shaped convex portion, first lower-surface ring-shaped convex portions, second lower-surface ring-shaped convex portion), and vent holes are formed on or in an upper surface or a lower surface of the ceramic sintered body. Further, grooved portions are formed so as to surround the vent holes in the lower surface. As a formation method thereof, for example, blast processing, milling processing, or laser processing is possible.

Each grooved portion formed in the lower surface is connected to a vacuum suction device through a stage, and communicates with at least one vent hole that opens in an upper surface of a base body. The cross-sectional area of each grooved portion in a direction perpendicular to a flow path direction is 1.2 mm² or greater. The cross-sectional area of each grooved portion in the direction perpendicular to the flow path direction is preferably 2.8 mm² or less. The width of each grooved portion is preferably 1.7 mm to 4.0 mm, and the depth of each grooved portion is preferably included in a range of ratio of 0.4 to 0.6 with respect to the thickness of the base body.

For example, the arrangement, the shape, and the protrusion height of the plurality of upper-surface convex portions or the plurality of second lower-surface convex portions are not particularly limited, and thus the plurality of upper-surface convex portions or the plurality of second lower-surface convex portions may be of a well-known form or of a form similar thereto. For example, they may be regularly arranged in a triangular lattice arrangement, a rectangular lattice arrangement, or a concentrically circular arrangement, or may be irregularly arranged with locally high or low density. Their shapes may be, for example, a columnar shape or a conical shape, or may be a stepped shape whose upper portion (upper end or lower end) has a cross-sectional area that is smaller than the cross-sectional area of its lower portion (base-body upper-surface side or base-body lower-surface side). The height and the like can be set in, for example, ranges in which the protrusion amount is 50 µm to 200 µm, the diameter is 500 µm or less, and the convex-portion-to-convex portion interval is 8 mm or less in accordance with the conditions for, for example, a substrate to be attracted.

An upper-surface ring-shaped convex portion is formed on the upper surface where the plurality of upper-surface convex portions are formed so as to surround the plurality of upper-surface convex portions. Further, a second lower-surface ring-shaped convex portion is formed on the lower surface where the plurality of second lower-surface convex portions are formed so as to surround the plurality of second lower-surface convex portions. Depending upon the design of the substrate holding member, the ring-shaped convex portions (upper-surface ring-shaped convex portion, second lower-surface ring-shaped convex portion) are preferably formed lower than the height of the plurality of lower-surface convex portions by 1 µm to 5 µm, or are preferably formed to be flush with the plurality of convex portions. The width of each ring-shaped convex portion is preferably 0.2 mm to 0.5 mm.

A plurality of first lower-surface convex portions are preferably formed from an upper end surface of each grooved portion. This suppresses a decrease in the flatness of a substrate caused by deformation of the base body. In accordance with whether or not a plurality of second lower-surface convex portions are to be formed, the plurality of first lower-surface convex portions are formed with heights that allow them to be substantially flush with the lower surface of the base body or the plurality of second lower-surface convex portions.

When a plurality of second lower-surface convex portions are to be formed on the lower surface, each first lower-surface ring-shaped convex portion that surrounds the grooved portion corresponding thereto is preferably formed around the grooved portion. In accordance with the design of the substrate holding member, each first lower-surface ring-shaped convex portion is preferably formed to be lower than the height of the plurality of second lower-surface convex portions by 1 µm to 5 µm, or is preferably formed to be substantially flush with the plurality of second lower-surface convex portions. The width of each first lower-surface ring-shaped convex portion is preferably 0.2 mm to 0.5 mm.

In this way, the substrate holding member of the present invention can be manufactured.

EXAMPLES AND COMPARATIVE EXAMPLE

Example 1

A plurality of upper-surface convex portions and a substantially circular ring-shaped rib (upper-surface ring-shaped convex portion) that surrounds the plurality of upper-surface convex portions were formed on an upper surface (substrate holding surface) of a substantially disk-shaped base body formed from a sintered body of silicon carbide and having a diameter of $\phi310$ mm and a thickness t of 1.2 mm. The height and the diameter of the plurality of upper-surface convex portions were 150 µm and $\phi300$ µm, respectively, and the interval between the upper-surface convex potions was 4.0 mm in a triangular lattice arrangement. The upper-surface ring-shaped convex portion having a substantially circular ring shape and surrounding the plurality of upper-surface convex portions was formed with a height being lower than the height of the plurality of upper-surface convex portions by 3 µm.

Two arc-shaped grooved portions having a length of 300 mm and extending in a peripheral direction were formed in the lower surface of the base body. The two grooved portions each had a width of 2.0 mm and a depth of 0.6 mm. That is, the cross-sectional area of each grooved portion in a direction perpendicular to a flow path direction was 1.2 mm². Further, ten vent holes having a hole diameter of $\phi0.6$ mm were formed with a pitch of 25 mm, and the substrate holding member of Example 1 was formed.

Example 2

A substrate holding member of Example 2 was formed under conditions similar to those of Example 1, except that first lower-surface convex portions were formed in each grooved portion. Here, each first lower-surface convex portion was disposed such that the center of each first lower-surface convex portion was located on a central line of a groove width, and the interval between the convex portions in a groove length direction was 4 mm. Note that the diameter of each first lower-surface convex portion is the same as that of the plurality of convex portions formed on the upper surface, and the height of each lower-surface convex portion is the same as the groove depth.

Example 3

A substrate holding member of Example 3 was formed under conditions similar to those of Example 2, except that each first lower-surface ring-shaped convex portion surrounding the grooved portion corresponding thereto and a second lower-surface ring-shaped convex portion surrounding in a ring shape each first lower-surface ring-shaped convex portion were formed and except that second lower-surface convex portions were formed between the first lower-surface ring-shaped convex portions and the second lower-surface ring-shaped convex portion. Here, the second lower surface convex portions were flush with lower ends of the first lower-surface convex portions so as to contact the upper surface of a stage, and each first lower-surface ring-shaped convex portion and the second lower-surface ring-shaped convex portion were formed with heights that were lower by 3 μm than the height of the first lower-surface convex portions and the height of the second lower-surface convex portions.

Example 4

A substrate holding member of Example 4 was formed under conditions similar to those of Example 2, except that the width of each grooved portion was 3.2 mm and the depth of each grooved portion was 0.6 mm (cross-sectional area=1.92 mm²) and except that first lower-surface convex portions were formed in two rows. Here, the first lower-surface convex portions were formed in two rows such that a center-to-center interval between the first lower-surface convex portions in a width direction of the grooved portions was 1.5 mm.

Example 5

A substrate holding member of Example 5 was formed under conditions similar to those of Example 2, except that the width of each grooved portion was 4.1 mm and the depth of each grooved portion was 0.6 mm (cross-sectional area=2.46 mm²) and except that first lower-surface convex portions were formed in two rows. Here, the first lower-surface convex portions were formed in two rows such that a center-to-center interval between the first lower-surface convex portions in a width direction of the grooved portions was 1.5 mm.

Comparative Example 1

A substrate holding member of Comparative Example 1 was formed under conditions similar to those of Example 1, except that the width of each grooved portion was 1.6 mm and the depth of each grooved portion was 0.6 mm (cross-sectional area=0.96 mm²).
Evaluation Method
As substrates to be attracted, substrates (silicon wafers) having a diameter of φ300 mm and a thickness of 0.7 mm were prepared. Note that, as substrates to be attracted, a substrate having a flatness (curve) of 0.4 mm and a substrate having a flatness (curve) of 0.8 mm were prepared. The substrates were each attracted to each of the prepared substrate holding members, and the attractions were evaluated. The flatness of each of the attracted substrates was confirmed by using a non-contact laser interferometer. For the flatness, a PV value of a rectangular region of each held substrate, any one side of the rectangle being 20 mm, was measured, and the PV value was a local flatness (LF). When the LF was 0.1 μm or less, it was determined that the substrate had a particularly good flatness (excellent); when the LF exceeded 0.1 μm and was 0.3 μm or less, it was determined that the substrate had good flatness (good); and when the LF exceeded 0.3 μm, it was determined that the substrate had bad flatness (poor). FIG. 10 shows a table of the conditions and evaluation results of the grooved portions of the examples and the grooved portions of the comparative example.
Evaluation Results
Even with regard to the substrate holding members of Examples 1 to 5, it was confirmed that the substrate having a flatness (curve) of 0.4 mm could be attracted. With regard to the flatness, although it was confirmed that, for the substrate holding member of Example 1, the flatness of a portion directly above the grooved portions was poorer than the flatness of other portions, the flatness of all locations of the substrate was 0.3 μm or less.

In contrast, with regard to the substrate holding member of Comparative Example 1, neither of the substrates could be attracted. This is thought to be because the cross-sectional area of each grooved portion was small and an attraction force large enough to allow the substrate having a flatness (curve) of 0.4 mm to be attracted could not be applied.

With regard to the substrate holding members of Examples 2 to 4, the flatness of all locations of the substrate became 0.1 μm or less, and the flatness of the substrate was in general better than the flatness of the substrate of Example 1. This is thought to be because, in Example 1, due to the formation of grooved portions having a large width, a slight bending of the base body directly above the grooved portions affected the flatness of the substrate, whereas, in Examples 2 to 4, due to the first lower-surface convex portions, bending of the base body directly above the grooved portions was sufficiently suppressed and the flatness of the base body became good.

With regard to the substrate holding member of Example 5, it was confirmed that each substrate could be attracted. However, it was confirmed that, since the width of each grooved portion was large, the volume of thin-walled portions directly above the grooved portions was large and that there were portions of the substrates having poor flatness due to bending of parts of the thin-walled portions. Therefore, it was confirmed that the width of each grooved portion should be 4.0 mm or less.

With regard to the substrate holding member of Example 4, it was confirmed that even the substrate having a flatness (curve) of 0.8 mm had excellent flatness and could be attracted. Therefore, it was confirmed that, due to an increase in the cross-sectional area of each grooved portion, an attraction effect of the bent or curved substrate could be provided.

The results above show that the substrate holding member of the present invention is capable of attracting with good flatness even a bent or curved substrate.

The present invention is not limited to the embodiment above, and it goes without saying the various modifications and equivalents are included within the scope of the present invention. The structures, the shapes, the number, the locations, the sizes, and the like of the structural elements shown in each figure are those for convenience of explanation, and may be changed as appropriate.

What is claimed is:
1. A substrate holding member comprising:
a flat-plate-shaped base body that has at least one vent hole and grooved portions, the at least one vent hole opening in an upper surface of the base body, the grooved portions communicating with the at least one vent hole and opening in a lower surface of the base body;
a plurality of upper-surface convex portions that are formed so as to protrude upward from the upper surface of the base body; and
an upper-surface ring-shaped convex portion that is formed in a ring shape along an outer periphery of the upper surface of the base body so as to protrude upward from the upper surface, wherein a cross-sectional area of the grooved portions in a direction perpendicular to a flow path direction is 1.2 mm$^2$ or greater;

in top view, the grooved portions are arc-shaped; and the number of grooved portions is two or more.

2. The substrate holding member according to claim 1, further comprising:

a plurality of first lower-surface convex portions that are formed so as to protrude downward from an upper end surface of the grooved portions.

3. The substrate holding member according to claim 2, wherein the first lower-surface convex portions are arranged when W/2 is 1.0 mm or greater, where W is a width of the grooved portions.

4. The substrate holding member according to claim 3, further comprising:

a first lower-surface ring-shaped convex portion that is formed so as to protrude downward from the lower surface of the base body in such a manner as to surround the grooved portions along an edge of the grooved portions;

a second lower-surface ring-shaped convex portion that is formed so as to protrude downward from the lower surface of the base body in such a manner as to surround the first lower-surface ring-shaped convex portion; and a plurality of second lower-surface convex portions that are arranged in at least a region between the first lower-surface ring-shaped convex portion and the second lower-surface ring-shaped convex portion, and that are formed so as to protrude downward from the lower surface of the base body.

5. The substrate holding member according to claim 2, further comprising:

a first lower-surface ring-shaped convex portion that is formed so as to protrude downward from the lower surface of the base body in such a manner as to surround the grooved portions along an edge of the grooved portions;

a second lower-surface ring-shaped convex portion that is formed so as to protrude downward from the lower surface of the base body in such a manner as to surround the first lower-surface ring-shaped convex portion; and a plurality of second lower-surface convex portions that are arranged in at least a region between the first lower-surface ring-shaped convex portion and the second lower-surface ring-shaped convex portion, and that are formed so as to protrude downward from the lower surface of the base body.

6. The substrate holding member according to claim 1, further comprising:

a first lower-surface ring-shaped convex portion that is formed so as to protrude downward from the lower surface of the base body in such a manner as to surround the grooved portions along an edge of the grooved portions;

a second lower-surface ring-shaped convex portion that is formed so as to protrude downward from the lower surface of the base body in such a manner as to surround the first lower-surface ring-shaped convex portion; and a plurality of second lower-surface convex portions that are arranged in at least a region between the first lower-surface ring-shaped convex portion and the second lower-surface ring-shaped convex portion, and that are formed so as to protrude downward from the lower surface of the base body.

7. The substrate holding member according to claim 1, further comprising:

wherein the depth of the grooved portions is more than 0.8 mm and 1.8 mm or less.

8. A substrate holding member comprising:

a flat-plate-shaped base body that has at least one vent hole and a grooved portion, the at least one vent hole opening in an upper surface of the base body, the grooved portion communicating with the at least one vent hole and opening in a lower surface of the base body;

a plurality of upper-surface convex portions that are formed so as to protrude upward from the upper surface of the base body; and an upper-surface ring-shaped convex portion that is formed in a ring shape along an outer periphery of the upper surface of the base body so as to protrude upward from the upper surface, wherein a cross-sectional area of the grooved portion in a direction perpendicular to a flow path direction is 1.2 mm$^2$ or greater; and the width of the grooved portion is more than 2.0 mm and 4.0 mm or less.

9. The substrate holding member according to claim 8, further comprising:

wherein the depth of the grooved portion is more than 0.8 mm and 1.8 mm or less.

10. The substrate holding member according to claim 8, further comprising:

a plurality of first lower-surface convex portions that are formed so as to protrude downward from an upper end surface of the grooved portion.

11. The substrate holding member according to claim 10, wherein the first lower-surface convex portions are arranged when W/2 is 1.0 mm or greater, where W is a width of the grooved portion.

12. The substrate holding member according to claim 11, further comprising:

a first lower-surface ring-shaped convex portion that is formed so as to protrude downward from the lower surface of the base body in such a manner as to surround the grooved portion along an edge of the grooved portion;

a second lower-surface ring-shaped convex portion that is formed so as to protrude downward from the lower surface of the base body in such a manner as to surround the first lower-surface ring-shaped convex portion; and a plurality of second lower-surface convex portions that are arranged in at least a region between the first lower-surface ring-shaped convex portion and the second lower-surface ring-shaped convex portion, and that are formed so as to protrude downward from the lower surface of the base body.

13. The substrate holding member according to claim 10, further comprising:

a first lower-surface ring-shaped convex portion that is formed so as to protrude downward from the lower surface of the base body in such a manner as to surround the grooved portion along an edge of the grooved portion;

a second lower-surface ring-shaped convex portion that is formed so as to protrude downward from the lower surface of the base body in such a manner as to surround the first lower-surface ring-shaped convex portion; and a plurality of second lower-surface convex portions that are arranged in at least a region between the first lower-surface ring-shaped convex portion and the second lower-surface ring-shaped convex portion, and that are formed so as to protrude downward from the lower surface of the base body.

14. The substrate holding member according to claim 8, further comprising:

a first lower-surface ring-shaped convex portion that is formed so as to protrude downward from the lower surface of the base body in such a manner as to surround the grooved portion along an edge of the grooved portion;

a second lower-surface ring-shaped convex portion that is formed so as to protrude downward from the lower surface of the base body in such a manner as to surround the first lower-surface ring-shaped convex portion; and a plurality of second lower-surface convex portions that are arranged in at least a region between the first lower-surface ring-shaped convex portion and the second lower-surface ring-shaped convex portion, and that are formed so as to protrude downward from the lower surface of the base body.

* * * * *